United States Patent
Hatano et al.

(10) Patent No.: US 10,436,850 B2
(45) Date of Patent: Oct. 8, 2019

(54) POWER STORAGE APPARATUS AND CONTROLLING METHOD FOR THE SAME

(71) Applicant: KABUSHIKI KAISHA TOYOTA JIDOSHOKKI, Kariya-shi, Aichi (JP)

(72) Inventors: Junichi Hatano, Kariya (JP); Takahiro Tsuzuku, Kariya (JP); Yuki Muramatsu, Kariya (JP)

(73) Assignee: KABUSHIKI KAISHA TOYOTA JIDOSHOKKI, Kariya-shi, Aichi (JP)

( * ) Notice: Subject to any disclaimer, the term of this patent is extended or adjusted under 35 U.S.C. 154(b) by 0 days.

(21) Appl. No.: 16/309,688

(22) PCT Filed: Jun. 19, 2017

(86) PCT No.: PCT/JP2017/022557
§ 371 (c)(1),
(2) Date: Dec. 13, 2018

(87) PCT Pub. No.: WO2017/221899
PCT Pub. Date: Dec. 28, 2017

(65) Prior Publication Data
US 2019/0137573 A1 May 9, 2019

(30) Foreign Application Priority Data
Jun. 22, 2016 (JP) .................. 2016-123523

(51) Int. Cl.
*H02J 7/00* (2006.01)
*G01R 31/3842* (2019.01)
(Continued)

(52) U.S. Cl.
CPC ... *G01R 31/3842* (2019.01); *G01R 19/16542* (2013.01); *G01R 31/36* (2013.01);
(Continued)

(58) Field of Classification Search
USPC ......................................... 320/132
See application file for complete search history.

(56) References Cited

U.S. PATENT DOCUMENTS

| 4,281,278 A | * | 7/1981 | Bilsky | ...................... G05B 9/02 |
| | | | | 136/293 |
| 7,679,328 B2 | * | 3/2010 | Mizuno | .............. G01R 31/3828 |
| | | | | 320/132 |

(Continued)

FOREIGN PATENT DOCUMENTS

| JP | 2005-295644 A | 10/2005 |
| JP | 2006-112786 A | 4/2006 |

(Continued)

OTHER PUBLICATIONS

International Search Report of PCT/JP2017/022557 dated Sep. 19, 2017 [PCT/ISA/210].

(Continued)

*Primary Examiner* — Samuel Berhanu
(74) *Attorney, Agent, or Firm* — Sughrue Mion, PLLC

(57) ABSTRACT

A power storage apparatus including a battery and a control circuit controlling charging/discharging of the battery, wherein the control circuit determines, when a predetermined time period that has elapsed after the charging/discharging of the battery was ended is shorter than a polarization elimination time period extending from a time at which the charging/discharging of the battery was ended to a time at which polarization of the battery was judged to have been eliminated, an estimated open-circuit voltage for the battery after the elimination of the polarization of the battery; determines the difference between a first estimated charge state and a charge state determined by a time at which the estimated open-circuit voltage was estimated; and determines a second estimated charge state by summing the state of charge determined by the time at which the estimated (Continued)

open-circuit voltage was estimated and the product of the difference and the reflection coefficient.

12 Claims, 7 Drawing Sheets

(51) Int. Cl.
    *G01R 31/36*      (2019.01)
    *H01M 10/48*      (2006.01)
    *G01R 19/165*      (2006.01)
    *H01M 10/44*      (2006.01)

(52) U.S. Cl.
    CPC ........... H01M 10/44 (2013.01); H01M 10/48 (2013.01); H02J 7/00 (2013.01); H02J 7/007 (2013.01)

(56) References Cited

U.S. PATENT DOCUMENTS

| | | |
|---|---|---|
| 8,965,722 B2 | 2/2015 | Yoshida et al. |
| 9,429,626 B2 | 8/2016 | Shiraishi et al. |
| 9,800,086 B2 | 10/2017 | Shiraishi et al. |
| 2004/0257045 A1* | 12/2004 | Sada .................. G01R 31/379 320/132 |
| 2006/0076929 A1 | 4/2006 | Tatsumi et al. |
| 2009/0271132 A1* | 10/2009 | Furukawa .......... G01R 31/3835 702/63 |
| 2012/0326726 A1 | 12/2012 | Tabuchi et al. |
| 2014/0079969 A1 | 3/2014 | Greening et al. |
| 2015/0241516 A1* | 8/2015 | Hotta .................. H01M 10/482 429/90 |

FOREIGN PATENT DOCUMENTS

| | | |
|---|---|---|
| JP | 2007-114149 A | 5/2007 |
| JP | 2012-137408 A | 7/2012 |
| JP | 2014-199238 A | 10/2014 |
| JP | 2016-065844 A | 4/2016 |
| JP | 2016-139525 A | 8/2016 |
| WO | 2011/118039 A1 | 9/2011 |
| WO | 2013/057784 A1 | 4/2013 |

OTHER PUBLICATIONS

Written Opinion of PCT/JP2017/022557 dated Sep. 19, 2017 [PCT/ISA/210].

* cited by examiner

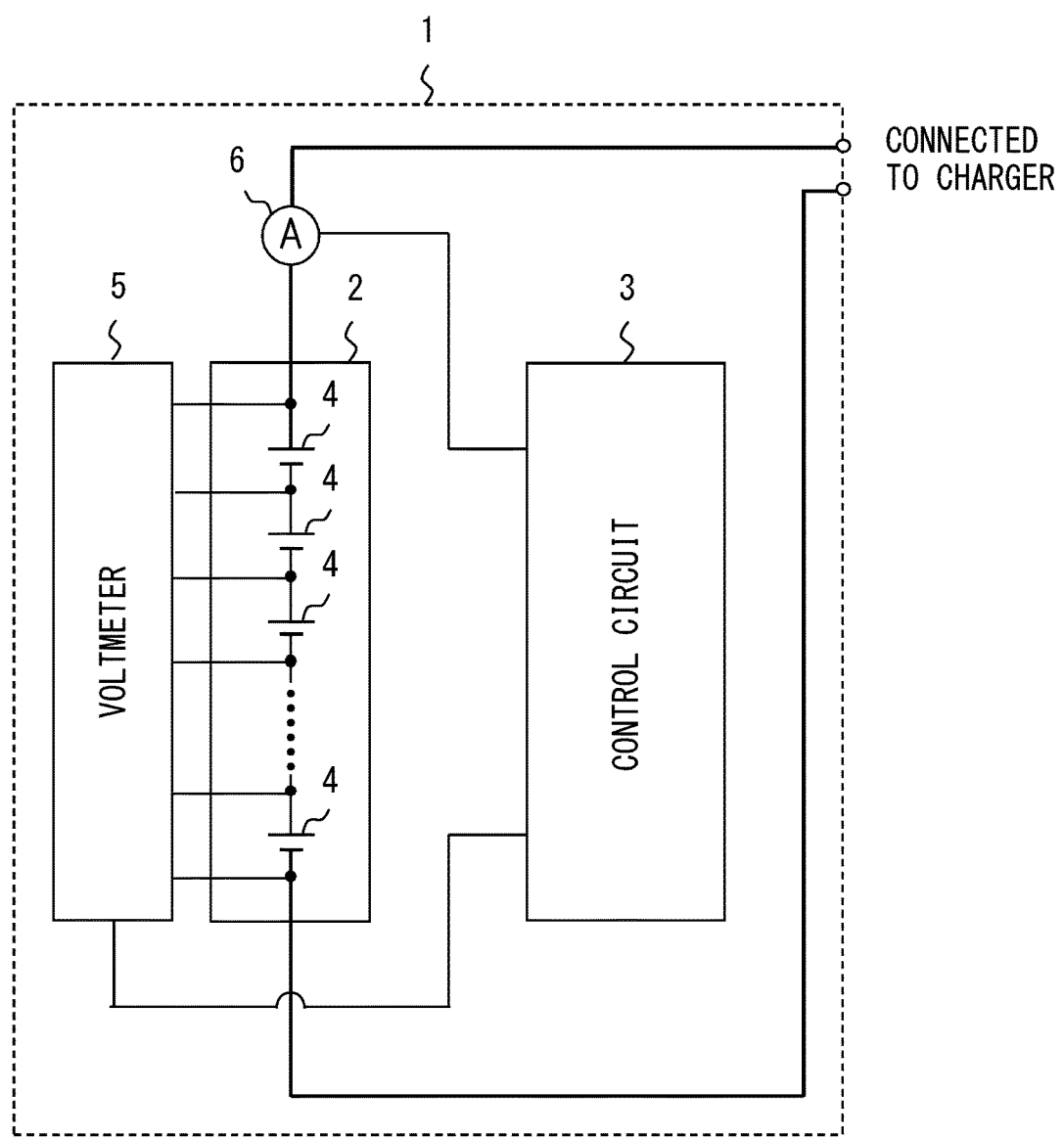
F I G. 1

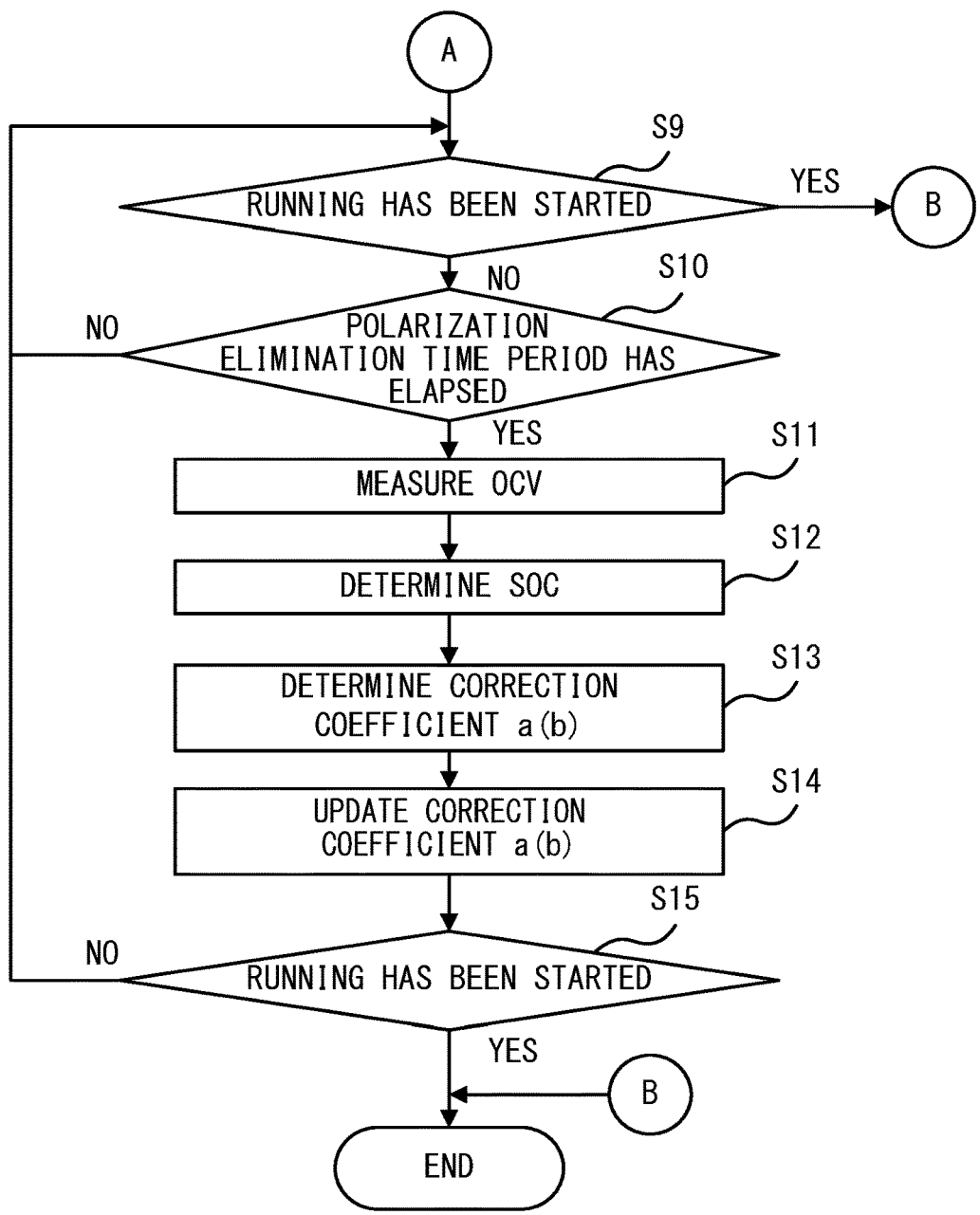
F I G. 6

POWER STORAGE APPARATUS AND CONTROLLING METHOD FOR THE SAME

CROSS REFERENCE TO RELATED APPLICATIONS

This application is a National Stage of International Application No. PCT/JP2017/022557, filed Jun. 19, 2017, claiming priority based on Japanese Patent Application No. 2016-123523, filed Jun. 22, 2016, the contents of these applications are incorporated herein by reference.

TECHNICAL FIELD

The present invention relates to a power storage apparatus for charging or discharging power and a controlling method for the same.

BACKGROUND ART

A technique is known wherein when the influence of polarization still remains after the charging or discharging of a battery has been ended, an open-circuit voltage (OCV) that would be provided if the polarization was eliminated is estimated from a measured temporal variation in the voltage of the battery, and the state of charge (SOC) is estimated on the basis of a SOC-OCV characteristic curve of the battery using the estimated open-circuit voltage.

Related techniques include the techniques described in patent literatures 1 and 2.

CITATION LIST

Patent Literature

Patent literature 1: Japanese Laid-open Patent Publication No. 2012-137408
Patent literature 2: Japanese Laid-open Patent Publication No. 2014-199238

SUMMARY OF INVENTION

Technical Problem

However, in determining an estimated state of charge using an estimated open-circuit voltage, determining the estimated state of charge using a region with a small slope in a SOC-OCV characteristic curve of a battery (a region with a large amount of change in the state of charge relative to the amount of change in the open-circuit voltage) is likely to cause, due to the influence of an error in a measured voltage value, a larger difference between the estimated state of charge and an actual state of charge than a difference that would be caused in determining an estimated state of charge using a region with a large slope in the SOC-OCV characteristic curve of the battery (a region with a small amount of change in the state of charge relative to the amount of change in the open-circuit voltage), thereby decreasing the accuracy in the estimation of the state of charge.

An object in accordance with an aspect of the present invention is to provide a power storage apparatus and a controlling method for the same, the power storage apparatus being capable of determining an accurate estimated state of charge even before polarization is eliminated after charging or discharging has been ended.

Means for Solving the Problem

A power storage apparatus in accordance with one mode includes a battery and a control circuit that controls the charging and discharging of the battery.

When a predetermined time period that has elapsed after the charging or discharging of the battery was ended is shorter than a polarization elimination time period extending from a time at which the charging or discharging of the battery was ended to a time at which polarization of the battery was judged to have been eliminated, the control circuit determines an estimated open-circuit voltage after the elimination of the polarization of the battery and determines a first estimated state of charge using the estimated open-circuit voltage. Subsequently, the control circuit determines a reflection coefficient that corresponds to the estimated open-circuit voltage and determines the difference between the first estimated state of charge and a state of charge determined by the time at which the estimated open-circuit voltage was estimated. Then, the control circuit determines a second estimated state of charge by summing the state of charge determined by the time at which the estimated open-circuit voltage was estimated and the product of the determined difference and the reflection coefficient.

Advantageous Effects of Invention

An accurate estimated state of charge can be determined even before polarization is eliminated after charging or discharging has been ended.

BRIEF DESCRIPTION OF DRAWINGS

FIG. 1 illustrates an implementation of a power storage apparatus;
FIG. 6 illustrates an implementation of an operation of a power storage apparatus.

DESCRIPTION OF EMBODIMENTS

Figure 2A:
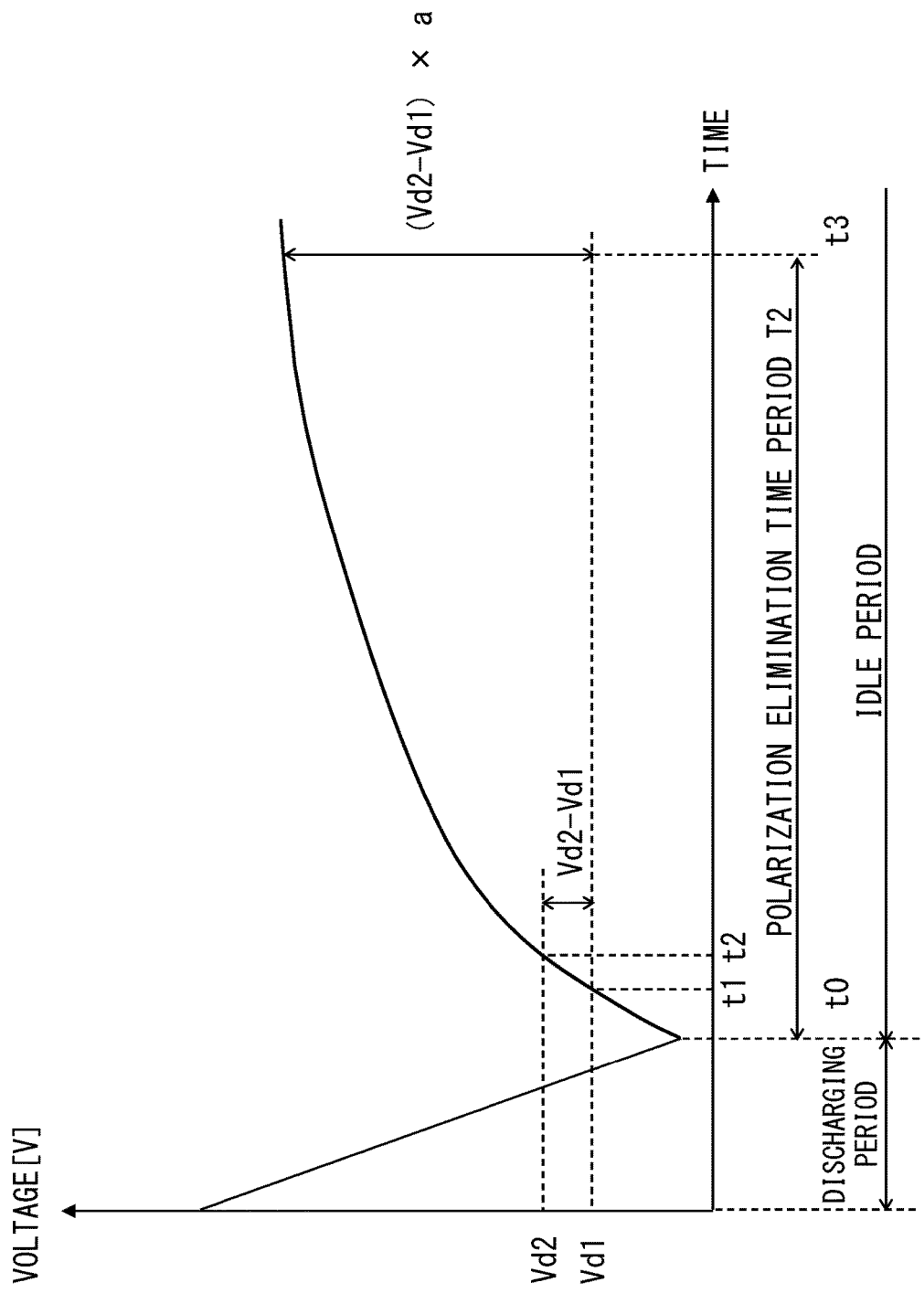
FIG. 2A illustrates exemplary changes in a battery voltage in a discharging period and a polarization elimination time period after discharging.

The following describes details of embodiments on the basis of the drawings.

FIG. 1 illustrates an implementation of a power storage apparatus 1. The power storage apparatus 1 depicted in FIG. 1 is, for example, a battery pack and can possibly be installed in a vehicle. In this example, the power storage apparatus 1 includes an assembled battery 2 provided with one or more batteries 4, a control circuit 3 that controls the power storage apparatus 1, a voltmeter 5 that measures a voltage of the battery 4, and an ammeter 6 that measures a current flowing through the assembled battery 2. The battery 4 is a rechargeable battery such as a lithium-ion battery, a power storage element, or the like.

The control circuit 3 controls the charging or discharging of the power storage apparatus 1 and the battery 4 and can be a circuit that uses, for example, a central processing unit (CPU), a multicore CPU, or a programmable device (e.g., field programmable gate array (FPGA), programmable logic device (PLD)). The control circuit 3 includes a storage part provided inside or outside thereof and reads and executes programs stored in the storage part for controlling components of the power storage apparatus 1. For this example, descriptions are given with reference to the control circuit 3. However, for example, one or more electronic control units (ECUs) installed in a vehicle may perform the control that would be performed by the control circuit 3.

When a predetermined time period T1 that has been elapsed after the end of the charging or discharging of the battery 4 is shorter than a polarization elimination time period T2 after the discharging, or a polarization elimination time period T3 after charging, which extends from a time at which the charging or discharging of the battery 4 was ended to a time at which polarization of the battery 4 was judged to have been eliminated, the control circuit 3 determines an estimated open-circuit voltage OCV1 obtained by estimating an open-circuit voltage after the elimination of the polarization of the battery 4 and determines a first estimated state of charge SOC1 using the estimated open-circuit voltage OCV1.

The polarization elimination time periods T2 and T3 are each a period in which a determination is made as to whether polarization of the battery 4 has been eliminated and also a period in which the polarization of the battery 4 can be judged to have been eliminated. For example, the polarization elimination time period T2 or T3 may be determined through an experiment or a simulation. The polarization elimination time period T2 or T3 is changed according to the temperature of the battery 4, and hence the polarization elimination time period T2 or T3 is desirably changed with temperature. The polarization elimination time periods T2 and T3 may be determined on the basis of the state of the battery 4. For example, the polarization elimination time periods T2 and T3 may be changed using the voltage of the battery 4, a current flowing through the assembled battery 2, internal resistance, or temperature.

Subsequently, after charging or discharging is ended, the control circuit 3 performs the following process to determine an accurate state of charge even before polarization is eliminated. The control circuit 3 determines a reflection coefficient k described hereinafter that corresponds to the estimated open-circuit voltage OCV1. Then, the control circuit 3 determines a difference sub between a state of charge SOC0 determined by a time at which the estimated open-circuit voltage OCV1 was estimated and the first estimated state of charge SOC1. After this, the control circuit 3 sums the state of charge SOC0 and the product of the difference sub and the reflection coefficient k, so as to determine a second estimated state of charge SOC2 that is more accurate than the first estimated state of charge SOC1.

A state of charge SOC0 determined by a time at which the estimated open-circuit voltage OCV1 was estimated refers to a state of charge determined on the basis of a current integration or closed-circuit voltage provided during charging or discharging. For example, the state of charge SOC0 may be determined from a state of charge before charging or discharging and a current integration provided during the charging or discharging, may be determined from a SOC-OCV characteristic curve using a closed-circuit voltage provided during the charging or discharging, or may be determined from the SOC-OCV characteristic curve using an open-circuit voltage estimated from the closed-circuit voltage provided during the charging or discharging. Note that the "during charging or discharging" includes a time at which the charging or discharging is ended.

In a method of determining a reflection coefficient k, a reflection coefficient k that corresponds to an estimated open-circuit voltage OCV1 is determined using, for example, an operational expression or a table for associating estimated open-circuit voltages OCV1 and reflection coefficients k stored in a storage part that have been determined on the basis of slopes in the SOC-OCV characteristic curve of the battery 4. The SOC-OCV characteristic curve is changed according to the temperature of the battery 4, and hence the reflection coefficient k is desirably changed with temperature. The reflection coefficient k may be determined on the basis of the state of the battery 4.

(A) Descriptions are given of an example of the estimating of an estimated open-circuit voltage OCV1 after the end of discharging.

FIG. 2A illustrates exemplary changes in the voltage of the battery 4 in a discharging period and a polarization elimination time period T2 after discharging. In FIG. 2A, the vertical axis indicates the voltage of the battery 4, and the horizontal axis indicates time.

The discharging of the battery 4 is ended at time t0, and when voltages Vd1 and Vd2 of the battery 4 are measured in a polarization elimination time period T2 after the discharging (between times t0 and t3) (when predetermined time period T1<polarization elimination time period T2), an estimated open-circuit voltage OCV1 of the battery 4 after elimination of the polarization of the battery 4 is determined on the basis of the difference between the voltages Vd1 and Vd2 of the battery 4 measured by a time at which the predetermined time period T1 ends, i.e., an amount of change (Vd2−Vd1). When the measurement is performed after the polarization elimination time period T2 has elapsed (when predetermined time period T1≥polarization elimination time period T2), the measured voltage of the battery 4 is defined as a measured open-circuit voltage OCV2.

In the example of FIG. 2A, the estimated open-circuit voltage OCV1 is determined by determining the amount of change (Vd2−Vd1) using the difference between the voltage Vd1 at a first time t1 and the voltage Vd2 at a second time t2 following the first time t1 in a period shorter than the polarization elimination time period T2, and by summing the voltage Vd1 at the first time t1 and the product of the amount of change (Vd2−Vd1) and an estimation coefficient a, i.e., an estimation coefficient for discharging. See formula 1.

$$OCV1 = Vd1 + (Vd2 - Vd1) \times a \quad \text{(Formula 1)}$$

The estimation coefficient a is updated on the basis of a voltage measured after the polarization elimination time period T2 has elapsed. The estimation coefficient a is updated using, for example, an accurate measured open-circuit voltage OCV2 measured after the polarization elimination time period T2 has elapsed. In particular, the accurate measured open-circuit voltage OCV2 that has been measured involves is a voltage measured after the elimination of polarization, and accordingly a new estimation coefficient a is determined using the measured open-circuit voltage OCV2 after the elimination of polarization. See formula 2. The determined estimation coefficient a will be used in estimating an estimated open-circuit voltage OCV1 after the end of the subsequent dischargings.

$$OCV2 = Vd1 + (Vd2 - Vd1) \times a \quad \text{(Formula 2)}$$

Alternatively, the estimated open-circuit voltage OCV1 may be determined by determining an amount of change (Vd2−Vd1) using the difference between the voltage Vd1 at the first time t1 (the voltage Vd1 measured at the first time t1) and the voltage Vd2 at the second time t2 following the first time t1 (the voltage Vd2 measured at the second time t2) in a period shorter than the polarization elimination time period T2, and by summing the voltage Vd2 at the second time t2 and the product of the amount of change (Vd2−Vd1) and an estimation coefficient a', i.e., an estimation coefficient for discharging. See formula 1'.

$$OCV1=Vd2+(Vd2-Vd1)\times a' \qquad \text{(Formula 1')}$$

The estimation coefficient a' is updated on the basis of a voltage measured after the polarization elimination time period T2 has elapsed. The estimation coefficient a' is updated using, for example, an accurate measured open-circuit voltage OCV2 measured after the polarization elimination time period T2 has elapsed. In particular, the accurate measured open-circuit voltage OCV2 that has been measured is a voltage measured after the elimination of polarization, and accordingly a new estimation coefficient a' is determined using the measured open-circuit voltage OCV2 after the elimination of polarization. See formula 2'. The determined estimation coefficient a' will be used in estimating an estimated open-circuit voltage OCV1 after the end of the subsequent dischargings.

$$OCV2=Vd2+(Vd2-Vd1)\times a' \qquad \text{(Formula 2')}$$

The determined estimation coefficient a or a' may be changed using at least one of the temperature, state of charge, and degree of deterioration of the battery 4.

When the current state of charge SOC of the battery 4 does not fall within a prescribed range (within a SOC specified value), the estimated open-circuit voltage OCV1 is not determined. In particular, when the state of charge of the battery 4 is low, a change in the state of charge is different from a change in the state of charge within the SOC specified value in the SOC-OCV characteristic curve of the battery 4, and hence the estimated open-circuit voltage OCV1 cannot be accurately determined. Accordingly, when the state of charge does not fall within the SOC specified value of the battery 4, the OCV may not be estimated.

In addition, when the measured open-circuit voltage OCV2 is measured after the polarization elimination time period T2 has elapsed, the estimated open-circuit voltage OCV1 is not determined for a predetermined time period. In particular, when the measured open-circuit voltage OCV2 is measured after the polarization elimination time period P2 has elapsed, the accuracy of the open-circuit voltage calculated from a state of charge calculated through a current integration is considered to become high for a predetermined time period, and hence the estimated open-circuit voltage OCV1 is not newly determined. For example, the predetermined time period may be, but not limited to, one hour or longer after the determination of the measured open-circuit voltage OCV2.

Determining the estimated open-circuit voltage OCV1 as described above allows an accurate estimated open-circuit voltage OCV1 to be determined even before polarization is eliminated after discharging has been ended.

(B) Descriptions are given of an example of the estimating of an estimated open-circuit voltage OCV1 after the end of charging.

Figure 2B:
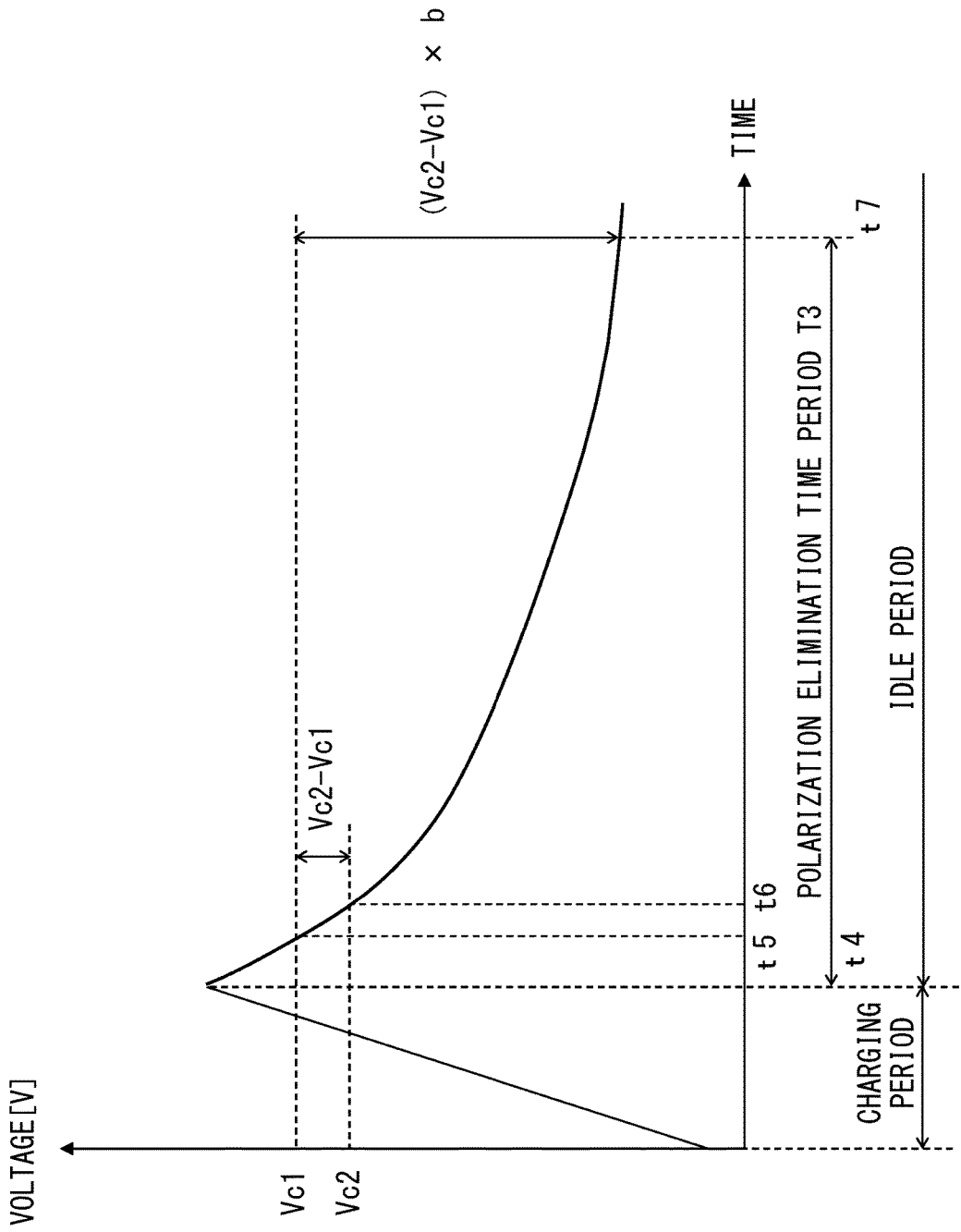
FIG. 2B illustrates exemplary changes in a battery voltage in a charging period and a polarization elimination time period after charging.

FIG. 2B illustrates exemplary changes in the voltage of the battery 4 in a charging period and a polarization elimination time period T3 after charging. In FIG. 2B, the vertical axis indicates the voltage of the battery 4, and the horizontal axis indicates time.

The charging of the battery 4 is ended at time t4, and when voltages Vc1 and Vc2 of the battery 4 are measured in a polarization elimination time period T3 after the charging (between time t4 and t7) (when predetermined time period T1<polarization elimination time period T3), an estimated open-circuit voltage OCV1 of the battery 4 after elimination of the polarization of the battery 4 is determined on the basis of the difference between the voltages Vc1 and Vc2 of the battery 4 measured by a time at which the predetermined time period T1 ends, i.e., an amount of change (Vc2−Vc1). When the measurement is performed after the polarization elimination time period T3 has elapsed (when predetermined time period T1≥polarization elimination time period T3), the measured voltage of the battery 4 is defined as a measured open-circuit voltage OCV2.

In the example of FIG. 2B, the estimated open-circuit voltage OCV1 is calculated by determining an amount of change (Vc2−Vc1) using the difference between the voltage Vc1 at a first time t5 and the voltage Vc2 at a second time t6 following the first time t5 in a period shorter than the polarization elimination time period T3, and by summing the voltage Vc1 at the first time t5 and the product of the amount of charge (Vc2−Vc1) and an estimation coefficient b, i.e., an estimation coefficient for charging. See formula 3.

$$OCV1=Vc1+(Vc2-Vc1)\times b \qquad \text{(Formula 3)}$$

The estimation coefficient b is updated on the basis of a voltage measured after the polarization elimination time period T3 has elapsed. The estimation coefficient b is updated using, for example, an accurate measured open-circuit voltage OCV2 measured after the polarization elimination time period T3 has elapsed. In particular, the accurate measured open-circuit voltage OCV2 that has been measured is a voltage measured after the elimination of polarization, and accordingly a new estimation coefficient b is determined using the measured open-circuit voltage OCV2 after the elimination of polarization. See formula 4. The determined estimation coefficient b will be used in estimating an estimated open-circuit voltage OCV1 after the end of the subsequent chargings.

$$OCV2=Vc1+(Vc2-Vc1)\times b \qquad \text{(Formula 4)}$$

Alternatively, the estimated open-circuit voltage OCV1 may be determined by determining an amount of change (Vc2−Vc1) using the difference between the voltage Vc1 at the first time t5 (the voltage Vc1 measured at the first time t5) and the voltage Vc2 at the second time t6 following the first time t5 (the voltage Vc2 measured at the second time t6) in a period shorter than the polarization elimination time period T3, and by summing the voltage Vc2 at the second time t6 and the product of the amount of change (Vc2−Vc1) and an estimation coefficient b', i.e., an estimation coefficient for charging. See formula 3'.

$$OCV1=Vc2+(Vc2-Vc1)\times b' \qquad \text{(Formula 3')}$$

The estimation coefficient b' is updated on the basis of a voltage measured after the polarization elimination time period T3 has elapsed. The estimation coefficient b' is updated using, for example, an accurate measured open-circuit voltage OCV2 measured after the polarization elimination time period T3 has elapsed. In particular, the accurate measured open-circuit voltage OCV2 that has been measured is a voltage measured after the elimination of polarization, and accordingly a new estimation coefficient b' is determined using the measured open-circuit voltage OCV2 after the elimination of polarization. See formula 4'. The determined estimation coefficient b' will be used in estimating an estimated open-circuit voltage OCV1 after the end of the subsequent chargings.

$$OCV2 = Vc2 + (Vc2 - Vc1) \times b' \quad \text{(Formula 4')}$$

The determined estimation coefficient b or b' may be changed using at least one of the temperature, state of charge, and degree of deterioration of the battery 4.

When the current state of charge SOC of the battery 4 does not fall within a prescribed range (within a SOC specified value), the estimated open-circuit voltage OCV1 is not determined. In particular, when the state of charge of the battery 4 is low, a change in the state of charge is different from a change in the state of charge within the SOC specified value in the OCV-SOC characteristic curve of the battery 4, and hence the estimated open-circuit voltage OCV1 cannot be accurately determined. Accordingly, when the state of charge does not fall within the SOC specified value of the battery 4, the OCV may not be estimated.

In addition, when the measured open-circuit voltage OCV2 is measured after the polarization elimination time period T3 has elapsed, the estimated open-circuit voltage OCV1 is not determined for a predetermined time period. In particular, when the measured open-circuit voltage OCV2 is measured after the polarization elimination time period P3 has elapsed, the accuracy of the open-circuit voltage calculated from a state of charge calculated through a current integration is considered to become high for a predetermined time period, and hence the estimated open-circuit voltage OCV1 is not newly determined. For example, the predetermined time period may be, but not limited to, one hour or longer after the determination of the measured open-circuit voltage OCV2.

Determining the estimated open-circuit voltage OCV1 as described above allows an accurate estimated open-circuit voltage OCV1 to be determined even before polarization is eliminated after charging has been ended.

As described above with reference to formulae 1-4 or formulae 1'-4', when, for example, a predetermined time period T1 that has been elapsed after the end of the charging or discharging of the battery 4 is shorter than a polarization elimination time period T2 after the discharging, or a polarization elimination time period T3 after charging, which extends from a time at which the charging or discharging of the battery 4 was ended to a time at which polarization of the battery 4 was judged to have been eliminated, the control circuit 3 determines, on the basis of the amount of change in the voltage of the battery 4 measured by the end of the predetermined time period T1, an estimated open-circuit voltage OCV1 obtained by estimating an open-circuit voltage after the elimination of the polarization of the battery 4 and determines a first estimated state of charge SOC1 using the estimated open-circuit voltage OCV1.

The control circuit 3 may be configured to estimate a first estimated state of charge SOC1 using an estimation method different from the estimation method described above with reference to formulae 1-4 or formulae 1'-4'.

For example, the control circuit 3 may be configured to determine a voltage variation curve using voltages detected by the voltmeter 5, estimate, on the basis of the determined voltage variation curve, an estimated open-circuit voltage OCV1 achieved at the time of elimination of polarization, and estimate a first estimated state of charge SOC1 at the time of elimination of polarization of the battery 4 by using the estimated open-circuit voltage OCV1 that has been estimated.

For example, the control circuit 3 may be configured to estimate an estimated open-circuit voltage OCV1 at the time of elimination of polarization by using a model of the battery (e.g., an equivalent circuit model of the battery 4) and estimate a first estimated state of charge SOC1 at the time of elimination of polarization of the battery 4 by using the estimated open-circuit voltage OCV1 that has been estimated.

For example, the control circuit 3 may be configured to estimate an estimated open-circuit voltage OCV1 at the time of elimination of polarization on the basis of a voltage detected by the voltmeter 5 at the time of start of charging or discharging and an open-circuit voltage that corresponds to a state of charge determined according to a current integration value of the battery 4 during the charging or discharging, and estimate a first estimated state of charge SOC1 at the time of elimination of polarization of the battery 4 by using the estimated open-circuit voltage OCV1 that has been estimated.

(C) Descriptions are given of the estimating of a first estimated state of charge SOC1.

When the predetermined time period T1 is shorter than the polarization elimination time period T2 or T3, the control circuit 3 determines a first estimated state of charge SOC1 by using an estimated open-circuit voltage OCV1. For example, a first estimated state of charge SOC1 that corresponds to the estimated open-circuit voltage OCV1 is determined using a SOC-OCV characteristic curve of the battery 4. Estimating the first estimated state of charge SOC1 by using the estimated open-circuit voltage OCV1 as described above allows an accurate first estimated state of charge SOC1 to be determined even before polarization is eliminated after charging or discharging has been ended.

When the predetermined time period T1 is as long as or longer than the polarization elimination time period T2 or T3, a state of charge is determined using a measured open-circuit voltage OCV2 that has been measured.

(D) Descriptions are given of the estimating of a second estimated state of charge SOC2.

When an estimated open-circuit voltage OCV1 includes an estimation error, the accuracy in the estimation of a first state of charge SOC1 is decreased due to the value of the estimated open-circuit voltage OCV1.

Figure 3:
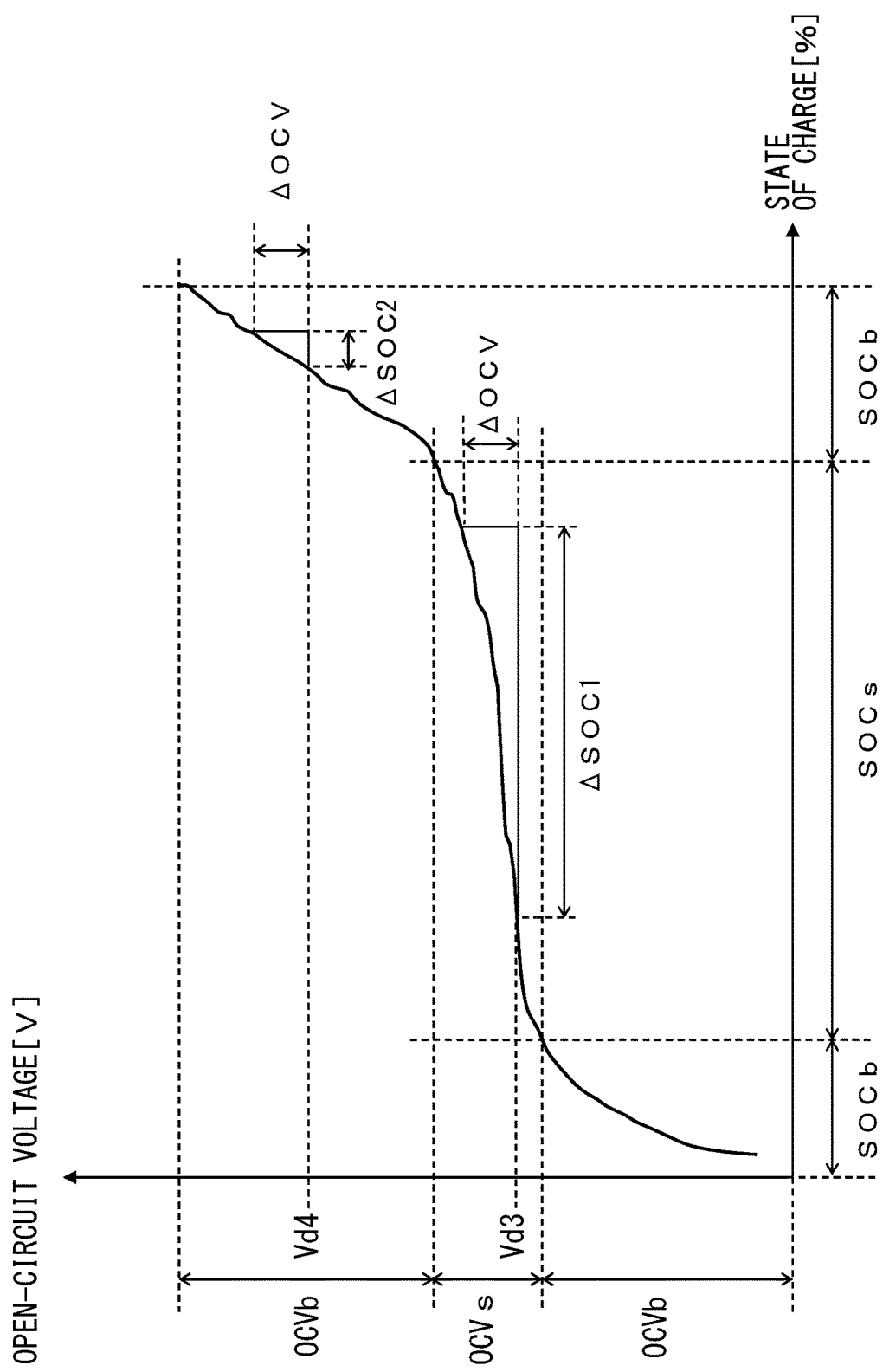
FIG. 3 illustrates an exemplary SOC-OCV characteristic curve of a battery.

FIG. 3 illustrates an exemplary SOC-OCV characteristic curve of the battery 4. In FIG. 3, the vertical axis indicates the open-circuit voltage of the battery 4, and the horizontal axis indicates the state of charge of the battery 4. In, for example, a case where an estimated open current voltage Vd3 within an open-circuit voltage range OCVs includes an estimation error (voltage ΔOCV) as indicated in FIG. 3, if a first estimated state of charge SOC1 is estimated on the basis of the estimated open current voltage Vd3, the first estimated state of charge SOC1 would also include an estimation error (state of charge ΔSOC1) that corresponds to the voltage ΔOCV. In a case where an estimated open current voltage Vd4 within an open-circuit voltage range OCVb includes an estimation error (voltage ΔOCV), if a first estimated state of charge SOC1 is estimated on the basis of the estimated open current voltage Vd4, the first estimated state of charge SOC1 would also include an error in estimation of a state of charge ΔSOC2 that corresponds to the voltage ΔOCV.

In estimating a first estimated state of charge SOC1 using an estimated open-circuit voltage OCV1 as indicated in FIG. 3, estimating the estimated state of charge using a flat region with a small slope in a SOC-OCV characteristic curve of the battery 4, i.e., a region with a large amount of change in the state of charge relative to the amount of change in the open-circuit voltage depicted in FIG. 3 (a predetermined voltage range OCVs or predetermined state-of-charge range SOCs), is likely to cause, due to the influence of an error in a measured voltage value, a larger difference between the first estimated state of charge SOC1 and an actual state of charge than that caused in estimating the estimated state of charge using a region with a large slope in the SOC-OCV characteristic curve of the battery 4, i.e., a region with a small amount of change in the state of charge relative to the amount of change in the open-circuit voltage depicted in FIG. 3 (a voltage range OCVb other than the predetermined voltage range OCVs or the state-of-charge range SOCb other than the predetermined state-of-charge range SOCs), thereby decreasing the accuracy in the estimation.

Accordingly, in accordance with whether an estimated open-circuit voltage OCV1 is included in a voltage range OCVb or whether the estimated open-circuit voltage OCV1 is included in a predetermined voltage range OCVs, a second estimated state of charge SOC2 is determined using a state of charge SOC0 determined on the basis of a current integration or closed-circuit voltage provided during charging or discharging that is determined by a time at which the estimated open-circuit voltage OCV1 is estimated, a first estimated state of charge SOC1, and a reflection coefficient k determined according to a slope of a SOC-OCV characteristic curve, so as to prevent the accuracy in the estimation of the estimated state of charge from being decreased.

Meanwhile, in accordance with whether a first estimated state of charge SOC1 is included in a state-of-charge range SOCb that corresponds to a voltage range OCVb or whether the first estimated state of charge SOC1 is included in a predetermined state-of-charge range SOCs that corresponds to a predetermined voltage range OCVs, a second estimated state of charge SOC2 may be determined using a state of charge SOC0 determined by a time at which an estimated open-circuit voltage OCV1 determined on the basis of a current integration or closed-circuit voltage provided during charging or discharging is estimated, the first estimated state of charge SOC1, and a reflection coefficient k determined according to a slope of a SOC-OCV characteristic curve.

The second estimated state of charge SOC2 is determined by determining a reflection coefficient k that corresponds to the estimated open-circuit voltage OCV1 or the first estimated state of charge SOC1, by determining the difference between the state of charge SOC0 and the first estimated state of charge SOC1 (SOC1−SOC0), and by summing the state of charge SOC0 determined by a time at which the estimated open-circuit voltage OCV1 is estimated and the product of the difference (SOC1−SOC0) and the reflection coefficient k. See formula 5.

$$SOC2 = SOC0 + (SOC1 - SOC0) \times k \quad \text{(Formula 5)}$$

The reflection coefficient k, which is a value within a range from 0 to 1, is determined by, for example, using the estimated open-circuit voltage OCV1 or the first estimated state of charge SOC1 and using an operational expression or a table for associating estimated open-circuit voltages OCV1 and reflection coefficients k stored in a storage part.

When, for example, the estimated open-circuit voltage OCV1 falls within the predetermined voltage range OCVs (a range that corresponds to a flat region in the SOC-OCV characteristic curve), the reflection coefficient k is a first reflection coefficient k1. When the estimated open-circuit voltage OCV1 does not fall within the predetermined voltage range OCVs (falls within the voltage range OCVb), the reflection coefficient k is a second reflection coefficient k2 that is higher than the first reflection coefficient k1.

When the first estimated state of charge SOC1 for the estimated open-circuit voltage OCV1 falls within the predetermined state-of-charge range SOCs (a range that corresponds to a flat region in the SOC-OCV characteristic curve), the reflection coefficient k is a first reflection coefficient k1. When the first estimated state of charge SOC1 for the estimated open-circuit voltage OCV1 does not fall within the predetermined state-of-charge range SOCs (falls within the state-of-charge range SOCb), the reflection coefficient k is a second reflection coefficient k2 that is higher than the first reflection coefficient k1.

The reflection coefficient k may be a fixed value for only a flat region. The reflection coefficient k may be changed, as appropriate, in accordance with the estimated open-circuit voltage OCV1 or the first estimated state of charge SOC1.

The configuration and control described above allow an accurate estimated state of charge to be determined even before polarization is eliminated after charging or discharging has been ended.

Figure 4:
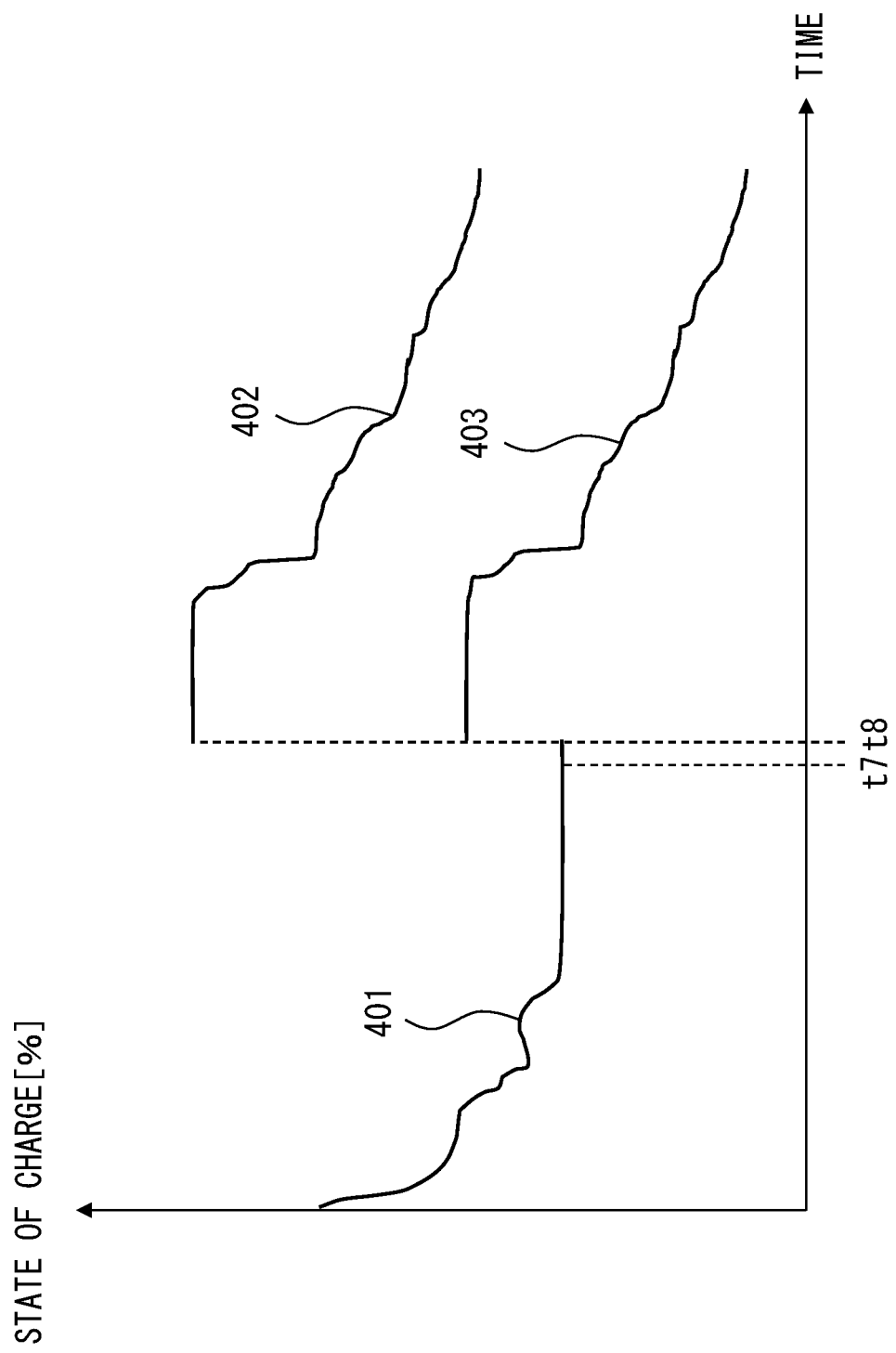
FIG. 4 illustrates examples of a first estimated state of charge and a second estimated state of charge.

FIG. 4 illustrates examples of a first estimated state of charge SOC1 and a second estimated state of charge SOC2. In FIG. 4, the vertical axis indicates the state of charge of the battery 4, and the horizontal axis indicates time. A curve 401 indicates a state of charge SOC0 determined on the basis of a current integration or closed-circuit voltage provided during charging or discharging. A curve 402 indicates a first estimated state of charge SOC1 for an estimated open-circuit voltage OCV1 with a flat region after the end of charging or discharging. A curve 403 indicates a second estimated state of charge SOC2 determined on the basis of an estimated open-circuit voltage OCV1 or first estimated state of charge SOC1 with a flat region after the end of charging or discharging.

Assume, for example, that as depicted in FIG. 4, a state of charge SOC0 determined at a time 7 preceding the time of estimation of an estimated open-circuit voltage OCV1 or an estimated open-circuit voltage OCV1 determined at a time t8 following the time of the end of charging or discharging is included in a flat region in a SOC-OCV characteristic curve and that a voltage ΔOCV is also included as an estimation error. In this case, the first estimated state of charge SOC1 with ΔSOC1 included in the state of charge as an estimation error is determined. A flat region in the SOC-OCV characteristic curve involves a large estimation error ΔSOC relative to the estimation error ΔOCV, thereby decreasing the accuracy in the estimation of the first estimated state of charge SOC1. However, the first estimated state of charge SOC1 is corrected into the second estimated state of charge SOC2 by making the reflection coefficient k small, so that the actual state of charge and the estimated state of charge can be prevented from having a large difference therebetween. Accordingly, the second estimated state of charge SOC2 can be closer to the state of charge SOC0 than the first estimated state of charge SOC1 is. When the estimated open-circuit voltage OCV1 is not included in a flat region, the estimation error ΔSOC relative to the estimation error ΔOCV is small, and hence the accuracy in the estimation of the first estimated state of charge SOC1 does not become low. Therefore, the second estimated state of charge SOC2 can be made close to the actual state of charge by making the reflection coefficient k large.

When the difference between the state of charge SOC0 determined by a time at which the estimated open-circuit voltage OCV1 is estimated and the second estimated state of charge SOC2 is equal to or greater than a predetermined value, the second estimated state of charge SOC2 can be changed to make the difference less than the predetermined value. Performing such a control allows the actual state of charge and the estimated state of charge to be prevented from having a large difference therebetween. The predetermined value is, for example, a value used to determine whether the second estimated state of charge SOC2 determined at time t8 falls within a range such that the second estimated state of charge SOC2 can be considered to be correct with reference to the state of charge SOC0 determined at time t7. The predetermined value is determined through an experiment or a simulation.

The following describes operations of the power storage apparatus 1.

Figure 5:
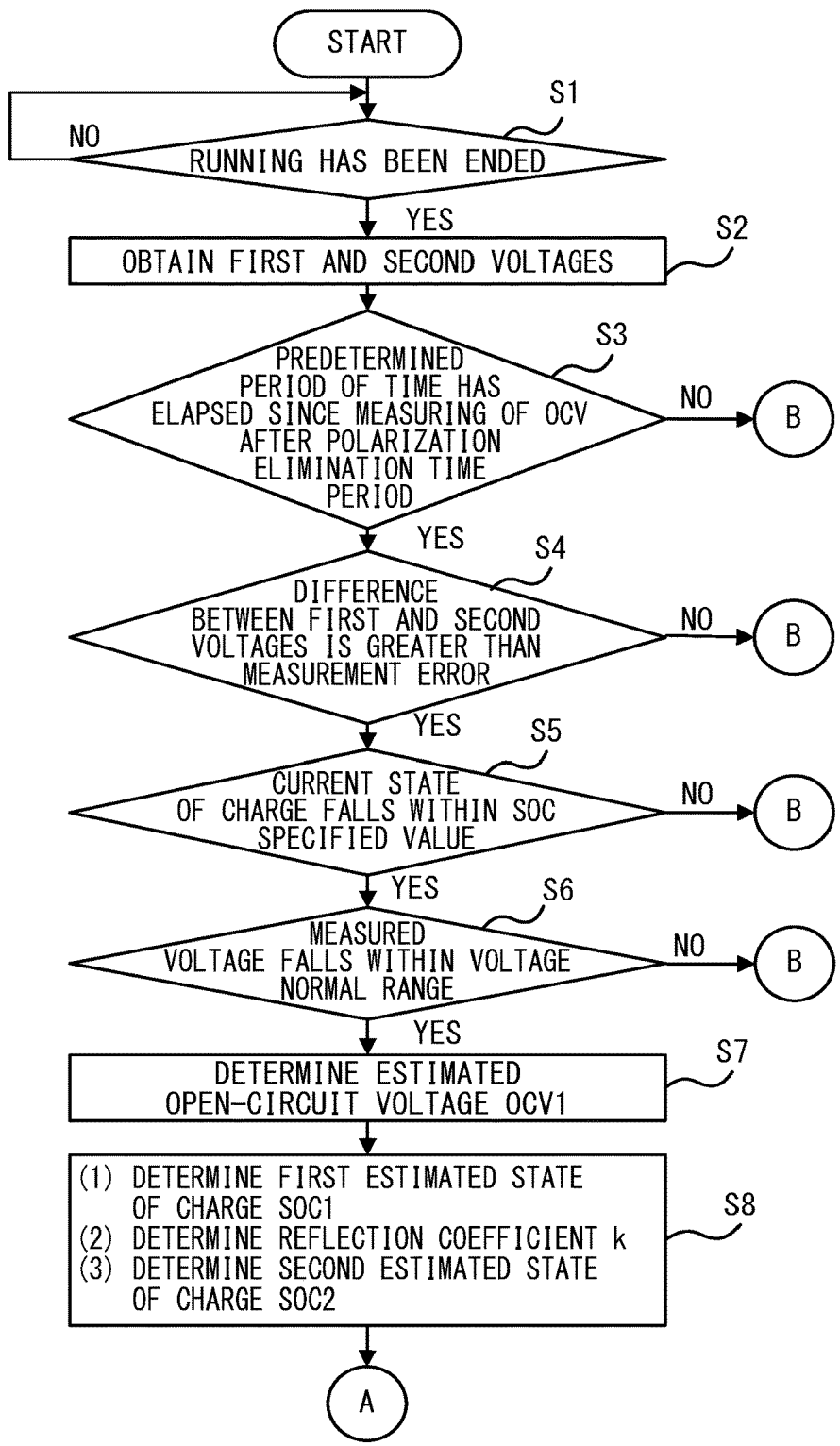
FIG. 5 illustrates an implementation of an operation of a power storage apparatus.

FIGS. 5 and 6 each illustrate an implementation of an operation of a power storage apparatus. When, for example, the power storage apparatus 1 is installed in a vehicle, the control circuit 3 determines in step S1 of FIG. 5 whether the vehicle has ended running or charging (discharging period in FIG. 2A, charging period in FIG. 2B); when the vehicle has ended running or charging (idle periods in FIG. 2A and FIG. 2B) (Yes), the process shifts to step S2, and when the vehicle has been running or charging (No), the process stays in step S1. In particular, it is determined in step S1 whether charging or discharging has been ended.

In step S2, the control circuit 3 obtains first and second voltages. In a situation after discharging, the voltage Vd1 at the first time t1 in FIG. 2A and the voltage Vd2 at the second time t2 following the first time are obtained. In a situation after charging, the voltage Vc1 at the first time t5 in FIG. 2B and the voltage Vc2 at the second time t6 following the first time are obtained.

In step S3, after a polarization elimination time period (polarization elimination time period T2 after discharging or polarization elimination time period T3 after charging) has elapsed, the control circuit 3 determines whether a predetermined period of time has elapsed since the measuring of a measured open-circuit voltage OCV2. When the predetermined time period has elapsed (Yes), the process shifts to step S4, and when the predetermined period of time has not elapsed (No), the process ends. When the measured open-circuit voltage OCV2 is measured after the polarization elimination time period has elapsed, an open-circuit voltage calculated from a state of charge calculated through current integration is considered to be accurate during the predetermined period of time, i.e., the state of charge calculated through current integration is considered to be more accurate, during the predetermined period of time, than the first estimated state of charge SOC1 estimated using the estimated open-circuit voltage OCV1, and hence the estimated open-circuit voltage OCV1 is not newly estimated. For example, the predetermined time period may be, but not particularly limited to, one hour or longer.

In step S4, the control circuit 3 determines whether the difference between the first and second voltages is greater than a predetermined value, e.g., a measurement error Ver. When the difference is greater than the measurement error Ver (Yes), the process shifts to step S5, and when the difference is equal to or less than the measurement error Ver (No), the process ends since there are no differences between the first and second voltages. When, for example, Vd2−Vd1>Ver during an idle period after discharging, the process shifts to step S5. When Vc1−Vc2>Ver during an idle period after charging, the process shifts to step S5.

The control circuit 3 determines in step S5 whether the current state of charge SOC of the battery 4 falls within a predetermined range (within a SOC specified value); when the state of charge falls within the SOC specified value (Yes), the process shifts to step S6, and when the state of charge does not fall within the SOC specified value (No), the process ends. In a range in which the state of charge of the battery 4 is low, the change in the OCV-SOC characteristic curve of the battery 4 is different from a change that could be seen if the state of charge fell within the SOC specified value, and hence the estimated open-circuit voltage OCV1 cannot be accurately estimated. Accordingly, the process ends when the state of charge of the battery 4 does not fill within the SOC specified value.

In step S6, it is determined whether the voltage measured by the control circuit 3 falls within a normal range (voltage normal range). When the voltage falls within the voltage normal range (Yes), the process shifts to step S7, and when the voltage does not fall within the voltage normal range (No), the process ends. In a case where a voltage cannot be measured normally due to noise or the like in step S6, if the measured voltage is used, an accurate open-circuit voltage could not be determined, and accordingly the process ends when a measured voltage affected by noise or the like is present. For example, after discharging, a voltage Vd3 is measured before the first time t1, a voltage Vd4 is measured before the second time t2, |(Vd2−Vd1)−(Vd4−Vd3)| is determined, and when the determined value falls within a normal range, it is determined that the influence of noise or the like is not present. After charging, a voltage Vc3 is measured before the first time t1, a voltage Vc4 is measured before the second time t2, |(Vc3−Vc4)−(Vc1−Vc2)| is determined, and when the determined value falls within a normal range, it is determined that the influence of noise or the like is not present. Steps S3-S6 may be omitted.

In step S7, by determining an amount of change by using the difference between the voltage at the first time t1 and the voltage at the second time t2 following the first time in a period shorter than the polarization elimination time period, and by summing the voltage at the first time t1 and the product of the determined amount of change and an estimation coefficient, the control circuit 3 determines an estimated open-circuit voltage OCV1. In a situation after discharging, the estimated open-circuit voltage OCV1 (=Vd1+(Vd2−Vd1)×a) may be determined on the basis of formula 1. Alternatively, in a situation after discharging, the estimated open-circuit voltage OCV1 (=Vd2+(Vd2−Vd1)×a') may be determined on the basis of formula 1'. In a situation after charging, the estimated open-circuit voltage OCV1 (=Vc1+(Vc2−Vc1)×b) may be determined on the basis of formula 3. Alternatively, in a situation after charging, the estimated open-circuit voltage OCV1 (=Vc2+(Vc2−Vc1)×b') may be determined on the basis of formula 3'.

In step S8, the control circuit 3 performs the following processes (1)-(3) to determine an accurate state of charge.
(1) A first estimated state of charge SOC1 is determined using the estimated open-circuit voltage OCV1. Determining the first estimated state of charge SOC1 using the estimated open-circuit voltage OCV1 in such a manner allows an accurate first estimated state of charge SOC1 to be determined even before polarization is eliminated after charging or discharging has been ended.
(2) A reflection coefficient k is determined on the basis of the estimated open-circuit voltage OCV1. The reflection coefficient k, which is a value within a range from 0 to 1, is determined by, for example, using the estimated open-circuit voltage OCV1 or the first estimated state of charge SOC1 and using a table for associating estimated open-circuit voltages OCV1 and reflection coefficients k stored in a storage part or a table for associating first estimated state of charges SOC1 and reflection coefficients k stored in the storage part. When, for example, the estimated open-circuit voltage OCV1 falls within a predetermined voltage range OCVs (a range that corresponds to a flat region in the SOC-OCV characteristic curve in FIG. 3), the reflection coefficient k is a first reflection coefficient k1. When the estimated open-circuit voltage OCV1 does not fall within the predetermined voltage range OCVs (falls within the voltage range OCVb), the reflection coefficient k is a second reflection coefficient k2 that is higher than the first reflection coefficient k1. When the first estimated state of charge SOC1 for the estimated open-circuit voltage OCV1 falls within a predetermined state-of-charge range SOCs (a range that corresponds to a flat region in the SOC-OCV characteristic curve in FIG. 3), the reflection coefficient k is the first reflection coefficient k1. When the first estimated state of charge SOC1 for the estimated open-circuit voltage OCV1 does not fall within the predetermined state-of-charge range SOCs (falls within the state-of-charge range SOCb), the reflection coefficient k is a second reflection coefficient k2 that is higher than the first reflection coefficient k1.

(3) The control circuit 3 determines the difference between the state of charge SOC0 and the first estimated state of charge SOC1 and sums the determined state of charge SOC1 and the product of the difference and the reflection coefficient so as to determine a second estimated state of charge SOC2 (=SOC0+(SOC1−SOC0)×k). See formula 5.

Performing the control indicated in step S8 allows an accurate state of charge to be determined even before polarization is eliminated after charging or discharging has been ended.

The reflection coefficient k may be a fixed value for only a flat region. The reflection coefficient k may be changed, as appropriate, in accordance with the estimated open-circuit voltage OCV1 or the first estimated state of charge SOC1. In addition, when the difference between the state of charge SOC0 determined by a time at which the estimated open-circuit voltage OCV1 is estimated and the second estimated state of charge SOC2 is equal to or greater than a predetermined value, the second estimated state of charge SOC2 can be changed to make the difference less than the predetermined value. Performing such a control allows the actual state of charge and the estimated state of charge can be prevented from having a large difference therebetween.

In step S9 in FIG. 6, the control circuit 3 determines whether the vehicle has started to run. When the vehicle has not started to run (No), the process shifts to step S10, and when the vehicle has started to run (Yes), the process ends.

When a polarization elimination time period has elapsed in step S10 (Yes), the control circuit 3 shifts to step S11, and when the polarization elimination time period has not elapsed (No), the control circuit 3 shifts to step S9.

In step S11, the control circuit 3 measures a measured open-circuit voltage OCV2. In step S12, the control circuit 3 determines a state of charge using the measured open-circuit voltage OCV2. In a situation after discharging, when the predetermined time period T1 is as long as or longer than the polarization elimination time period T2, a measured voltage of the battery 4 is defined as the measured open-circuit voltage OCV2, and a state of charge is determined using the measured open-circuit voltage OCV2. In a situation after charging, when the predetermined time period T1 is as long as or longer than the polarization elimination time period T3, the measured voltage of the battery 4 is defined as the measured open-circuit voltage OCV2, and a state of charge is determined using the measured open-circuit voltage OCV2.

In step S13, the control circuit 3 determines a correction coefficient. In step S14, the control circuit 3 updates the correction coefficient. An estimation coefficient a or a', i.e., an estimation coefficient for discharging, is updated on the basis of a voltage measured after the polarization elimination time period T2 has elapsed. A new estimation coefficient a may be determined using, for example, an accurate measured open-circuit voltage OCV2 that has been measured (OCV2=Vd1+(Vd2−Vd1)×a). See formula 2. A new estimation coefficient a' may be determined using, for example, an accurate measured open-circuit voltage OCV2 that has been measured (OCV2=Vd2+(Vd2−Vd1)×a'). See formula 2'. An estimation coefficient b or b', i.e., an estimation coefficient for charging, is updated on the basis of a voltage measured after the polarization elimination time period T3 has elapsed. A new estimation coefficient b may be determined using, for example, an accurate measured open-circuit voltage OCV2 that has been measured (OCV2=Vc1+(Vc2−Vc1)×b). See formula 4. A new estimation coefficient b' may be determined using, for example, an accurate measured open-circuit voltage OCV2 that has been measured (OCV2=Vc2+(Vc2−Vc1)×b'). See formula 4'. Estimation coefficients may be determined by performing weighting through moving averages.

In step S15, the control circuit 3 determines whether the vehicle has started to run. When the vehicle has not started to run (No), the process shifts to step S9, and when the vehicle has started to run (Yes), the process ends. Steps S13 and S14 may be performed after step S15 is performed.

Determining the estimated open-circuit voltage OCV1 as described above allows a first estimated state of charge SOC1 with high accuracy in estimation to be determined even before polarization is eliminated after charging or discharging has been ended. Estimating a state of charge using the state of charge SOC0, the reflection coefficient k, and the first estimated state of charge SOC1 allows a second estimated state of charge SOC2 with higher accuracy in estimation than the first estimated state of charge SOC1 to be determined. Using a reflection coefficient k determined according to a slope of a SOC-OCV characteristic curve (i.e., the range of the estimated open-circuit voltage OCV1 or the range of the first estimated state of charge SOC1) allows a second estimated state of charge SOC2 with higher accuracy in estimation to be determined.

The present invention is not limited to the embodiments described above and can be variously modified or changed without departing from the gist of the invention.

EXPLANATION OF THE CODES

1: Power storage apparatus
2: Assembled battery
3: Control circuit
4: Battery
5: Voltmeter
6: Ammeter

The invention claimed is:
1. A power storage apparatus comprising:
a battery; and
a control circuit that controls charging and discharging of the battery, wherein
the control circuit
when a predetermined time period that has elapsed after the charging or discharging of the battery was ended is shorter than a polarization elimination time period extending from a time at which the charging or discharging of the battery was ended to a time at which polarization of the battery was judged to have been eliminated, determines an estimated open-circuit voltage after the elimination of the polarization of the battery,
determines a first estimated state of charge using the estimated open-circuit voltage,
determines a reflection coefficient on the basis of the estimated open-circuit voltage,
determines a difference between the first estimated state of charge and a state of charge determined by a current integration, and
determines a second estimated state of charge by summing the state of charge determined by the time at which the estimated open-circuit voltage was estimated and a product of the difference and the reflection coefficient.

2. The power storage apparatus of claim 1, wherein
when the predetermined time period that has elapsed after the charging or discharging of the battery was ended is shorter than the polarization elimination time period extending from the time at which the charging or discharging of the battery was ended to the time at which polarization of the battery was judged to have been eliminated, the control circuit determines, on the basis of an amount of change in a voltage of the battery measured by an end of the predetermined time period, an estimated open-circuit voltage after the elimination of a polarization of the battery.

3. The power storage apparatus of claim 1, wherein
when the estimated open-circuit voltage falls within a predetermined voltage range, the reflection coefficient is a first reflection coefficient, and
when the estimated open-circuit voltage does not fall within the predetermined voltage range, the reflection coefficient is a second reflection coefficient that is higher than the first reflection coefficient.

4. The power storage apparatus of claim 1, wherein
when the first estimated state of charge that corresponds to the estimated open-circuit voltage falls within a predetermined state-of-charge range, the reflection coefficient is a first reflection coefficient, and
when the first estimated state of charge does not fall within the predetermined state-of-charge range, the reflection coefficient is a second reflection coefficient that is higher than the first reflection coefficient.

5. The power storage apparatus of claim 1, wherein
when a difference between the second estimated state of charge and the state of charge determined by the time at which the estimated open-circuit voltage was estimated is equal to or greater than a predetermined value, the second estimated state of charge is changed to make the difference less than the predetermined value.

6. The power storage apparatus of claim 1, wherein
the control circuit calculates the estimated open-circuit voltage by determining the amount of change using a difference between a voltage at a first time and a voltage at a second time following the first time in a period shorter than the polarization elimination time period, and by summing the voltage at the first time and a product of the amount of change and an estimation coefficient.

7. The power storage apparatus of claim 1, wherein
the control circuit calculates the estimated open-circuit voltage by determining the amount of change using a difference between a voltage at a first time and a voltage at a second time following the first time in a period shorter than the polarization elimination time period, and by summing the voltage at the second time and a product of the amount of change and an estimation coefficient.

8. The power storage apparatus of claim 6, wherein
the estimation coefficient is updated on the basis of a voltage measured after the polarization elimination time period has elapsed.

9. The power storage apparatus of claim 1, wherein
when the first estimated state of charge does not fall within a SOC specified value, the control circuit does not determine the estimated open-circuit voltage.

10. The power storage apparatus of claim 1, wherein
when the estimated open-circuit voltage is measured after the polarization elimination time period has elapsed, the control circuit does not estimate the estimated open-circuit voltage for a predetermined time period.

11. A controlling method for a power storage apparatus comprising a battery and a control circuit that controls charging and discharging of the battery, the controlling method comprising performing, by the power storage apparatus:
when a predetermined time period that has elapsed after the charging or discharging of the battery was ended is shorter than a polarization elimination time period extending from a time at which the charging or discharging of the battery was ended to a time at which polarization of the battery was judged to have been eliminated, determining an estimated open-circuit voltage after the elimination of the polarization of the battery;
determining a first estimated state of charge using the estimated open-circuit voltage;
determining a reflection coefficient on the basis of the estimated open-circuit voltage;
determining a difference between the first estimated state of charge and a state of charge determined by a current integration; and
determining a second estimated state of charge by summing the state of charge determined by the time at which the estimated open-circuit voltage was estimated and a product of the difference and the reflection coefficient.

12. A power storage apparatus comprising:
a battery; and
a control circuit that controls charging and discharging of the battery, wherein
the control circuit
when a predetermined time period that has elapsed after the charging or discharging of the battery was ended is shorter than a polarization elimination time period extending from a time at which the charging or discharging of the battery was ended to a time at which polarization of the battery was judged to have been eliminated, determines an estimated open-circuit voltage after the elimination of the polarization of the battery,
determines a first estimated state of charge using the estimated open-circuit voltage,
determines a reflection coefficient on the basis of the estimated open-circuit voltage,
determines a difference between the first estimated state of charge and a state of charge determined by using a closed-circuit voltage provided during the charging or discharging of the battery, and
determines a second estimated state of charge by summing the state of charge determined by the time at which the estimated open-circuit voltage was estimated and a product of the difference and the reflection coefficient.

* * * * *